(12) United States Patent
Kumagai

(10) Patent No.: US 11,538,902 B2
(45) Date of Patent: Dec. 27, 2022

(54) SILICON CARBIDE SEMICONDUCTOR DEVICE

(71) Applicant: FUJI ELECTRIC CO., LTD., Kawasaki (JP)

(72) Inventor: Naoki Kumagai, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 18 days.

(21) Appl. No.: 17/159,934

(22) Filed: Jan. 27, 2021

(65) Prior Publication Data
US 2021/0296435 A1  Sep. 23, 2021

(30) Foreign Application Priority Data
Mar. 17, 2020 (JP) .............................. JP2020-046990

(51) Int. Cl.
| | | |
|---|---|---|
| H01L 29/06 | (2006.01) | |
| H01L 29/16 | (2006.01) | |
| H01L 29/10 | (2006.01) | |
| H01L 29/66 | (2006.01) | |
| H01L 21/04 | (2006.01) | |
| H01L 29/78 | (2006.01) | |

(52) U.S. Cl.
CPC .......... *H01L 29/063* (2013.01); *H01L 21/047* (2013.01); *H01L 21/0465* (2013.01); *H01L 29/1095* (2013.01); *H01L 29/1608* (2013.01); *H01L 29/66068* (2013.01); *H01L 29/7813* (2013.01)

(58) Field of Classification Search
CPC . H01L 29/063; H01L 21/0465; H01L 21/047; H01L 29/1095; H01L 29/1608; H01L 29/66068; H01L 29/7813; H01L 29/0607; H01L 29/086; H01L 29/0878; H01L 21/0485; H01L 29/0623
See application file for complete search history.

(56) References Cited

U.S. PATENT DOCUMENTS

| | | | |
|---|---|---|---|
| 2020/0098910 A1 | 3/2020 | Nakagawa et al. | |
| 2020/0152748 A1* | 5/2020 | Okumura | ............ H01L 29/0865 |

FOREIGN PATENT DOCUMENTS

| | | |
|---|---|---|
| JP | 2015-065365 A | 4/2015 |
| WO | 2017/126472 A1 | 7/2017 |

* cited by examiner

*Primary Examiner* — Cuong B Nguyen
(74) *Attorney, Agent, or Firm* — Rabin & Berdo, P.C.

(57) ABSTRACT

A silicon carbide semiconductor device, including a semiconductor substrate, and a first semiconductor region, a plurality of second semiconductor regions, a plurality of third semiconductor regions and a plurality of fourth semiconductor regions formed in the semiconductor substrate. The semiconductor device further includes a plurality of trenches penetrating the second, third and fourth semiconductor regions, a plurality of gate electrodes respectively provided via a plurality of gate insulating films in the trenches, a plurality of fifth semiconductor regions each provided between one of the gate insulating films at the inner wall of one of the trenches, and the third semiconductor region and the fourth semiconductor region through which the one trench penetrates. The semiconductor device further includes first electrodes electrically connected to the second, third and fourth semiconductor regions, and a second electrode provided on a second main surface of the semiconductor substrate.

3 Claims, 7 Drawing Sheets

SILICON CARBIDE SEMICONDUCTOR DEVICE

CROSS REFERENCE TO RELATED APPLICATIONS

This application is based upon and claims the benefit of priority of the prior Japanese Patent Application No. 2020-046990, filed on Mar. 17, 2020, the entire contents of which are incorporated herein by reference.

BACKGROUND OF THE INVENTION

1. Field of the Invention

Embodiments of the invention relate to a silicon carbide semiconductor device.

2. Description of the Related Art

Conventionally, in a vertical metal oxide semiconductor field effect transistor (MOSFET) having insulated gates formed by a three-layered structure including a metal, an oxide film, and a semiconductor and having trench gate structures using silicon carbide (SiC) as a semiconductor material, an n-type region (hereinafter, n-type source resistance region) that forms source resistance Rs is provided between an $n^+$-type source region and a channel (n-type inversion layer), and a resistance value of the source resistance Rs is increased, whereby a tradeoff relationship between enhancement of short circuit capability and reduction of ON resistance Ron by a source follower effect is improved.

A structure of a conventional silicon carbide semiconductor device is described. FIG. 12 is a cross-sectional view of the structure of the conventional silicon carbide semiconductor device. A conventional silicon carbide semiconductor device 110 depicted in FIG. 12 is a vertical MOSFET having trench gate structures on a front side of a semiconductor substrate 130 that contains silicon carbide as a semiconductor material. The semiconductor substrate 130 is an epitaxial substrate in which epitaxial layers 132, 133 that form an $n^-$-type drift region 102 and p-type base regions 103 are sequentially stacked on an $n^+$-type starting substrate 131 ($n^+$-type drain region 101).

In the epitaxial layer 133 of a p-type, the $n^+$-type source regions 104a and $p^{++}$-type contact regions 105 are each selectively provided in surface regions of the semiconductor substrate 130, at a front surface thereof (a main surface thereof that is a surface of the epitaxial layer 133). The p-type base regions 103 are provided between the epitaxial layer 132 of an $n^-$-type and the $n^+$-type source regions 104a and the $p^{++}$-type contact regions 105. N-type source resistance regions 104b are each provided to be between one of the $n^+$-type source regions 104a and one of the p-type base regions 103, at a portion thereof in which a channel 103a is formed.

The $n^+$-type source regions 104a and the n-type source resistance regions 104b are in contact with gate insulating films 107 at sidewalls of trenches 106. By providing the n-type source resistance regions 104b, the resistance value of the source resistance Rs (series resistance from a source electrode 112 to ends of the channels 103a closest to the source electrode) may be increased. Reference numerals 109 and 113 are an interlayer insulating film and a drain electrode, respectively. Reference numeral 111 is a metal electrode (hereinafter, ohmic electrode) in ohmic contact with the semiconductor substrate 130.

As a conventional silicon carbide semiconductor device, a vertical MOSFET has been proposed, the vertical MOSFET having trench gate structures that have layered regions in which between $n^+$-type source regions and trenches, along sidewalls of the trenches, p-type regions of an upper layer and exposed at the front surface of a semiconductor substrate are stacked on n-type regions of a lower layer, in contact with the p-type regions (for example, refer to International Publication No. WO 2017/126472). In International Publication No. WO 2017/126472, by the layered regions between the $n^+$-type source regions and the trenches, increased suppression of ON resistance and high short circuit capability are realized.

Further, as a conventional silicon carbide semiconductor device, a vertical MOSFET has been proposed, the vertical MOSFET having trench gate structures that have p-type base regions at portions of $p^+$-type base regions where channels are formed, the p-type base regions having an impurity concentration that is lower than that of the $p^+$-type base regions (for example, refer to Japanese Laid-Open Patent Publication No. 2015-065365). In Japanese Laid-Open Patent Publication No. 2015-065365, by providing the p-type base regions having a low impurity concentration near the channels, breakdown voltage during an OFF state is increased by increasing the design margin for the gate threshold voltage and providing the $p^+$-type base regions having a high impurity concentration at a center of a mesa region between adjacent trenches.

SUMMARY OF THE INVENTION

According to an embodiment of the invention, a silicon carbide semiconductor device includes a semiconductor substrate containing silicon carbide and having a first main surface and a second main surface opposite to each other; a first semiconductor region of a first conductivity type, provided in the semiconductor substrate; a plurality of second semiconductor regions of a second conductivity type, provided in the semiconductor substrate, between the first main surface of the semiconductor substrate and the first semiconductor region; a plurality of third semiconductor regions of the first conductivity type, provided in the semiconductor substrate, between the first main surface of the semiconductor substrate and the second semiconductor regions; a plurality of fourth semiconductor regions of the first conductivity type, each provided in the semiconductor substrate between one of the second semiconductor regions and one of the third semiconductor regions, and adjacent to the one third semiconductor region in a depth direction, the fourth semiconductor regions having an impurity concentration lower than that of the third semiconductor regions; a plurality of trenches penetrating the third semiconductor regions, the fourth semiconductor regions, and the second semiconductor regions; a plurality of gate insulating films provided along inner walls of the trenches, respectively; a plurality of gate electrodes respectively provided on the gate insulating films in the trenches; a plurality of fifth semiconductor regions of the second conductivity type, each provided in the semiconductor substrate between, on one side thereof, one of the gate insulating films at the inner wall of one of the trenches, and on the other side thereof, one of the third semiconductor regions and one of the fourth semiconductor regions through both of which said one trench penetrates, said each fifth semiconductor region being adjacent to said one third semiconductor region, said one fourth semiconductor region, and said one gate insulating film; a plurality of first electrodes electrically connected to the third semiconductor regions, the fourth semiconductor regions, and the second semiconductor regions; and a second electrode provided on the second main surface of the semiconductor substrate.

Objects, features, and advantages of the present invention are specifically set forth in or will become apparent from the following detailed description of the invention when read in conjunction with the accompanying drawings.

DETAILED DESCRIPTION OF THE INVENTION

Figure 11:
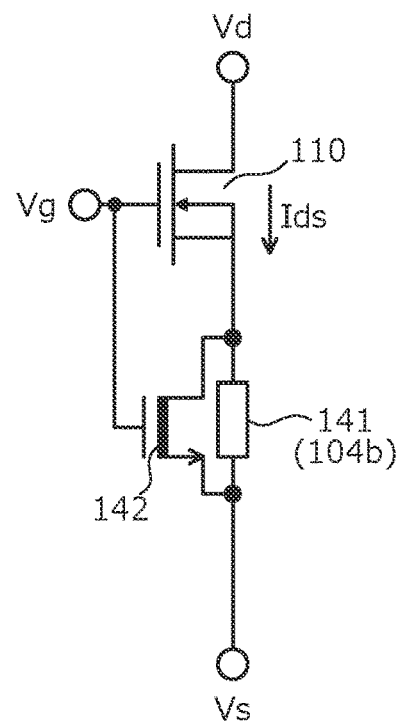
FIG. 11 is a circuit diagram depicting an equivalent circuit of FIG. 12.
Figure 12:
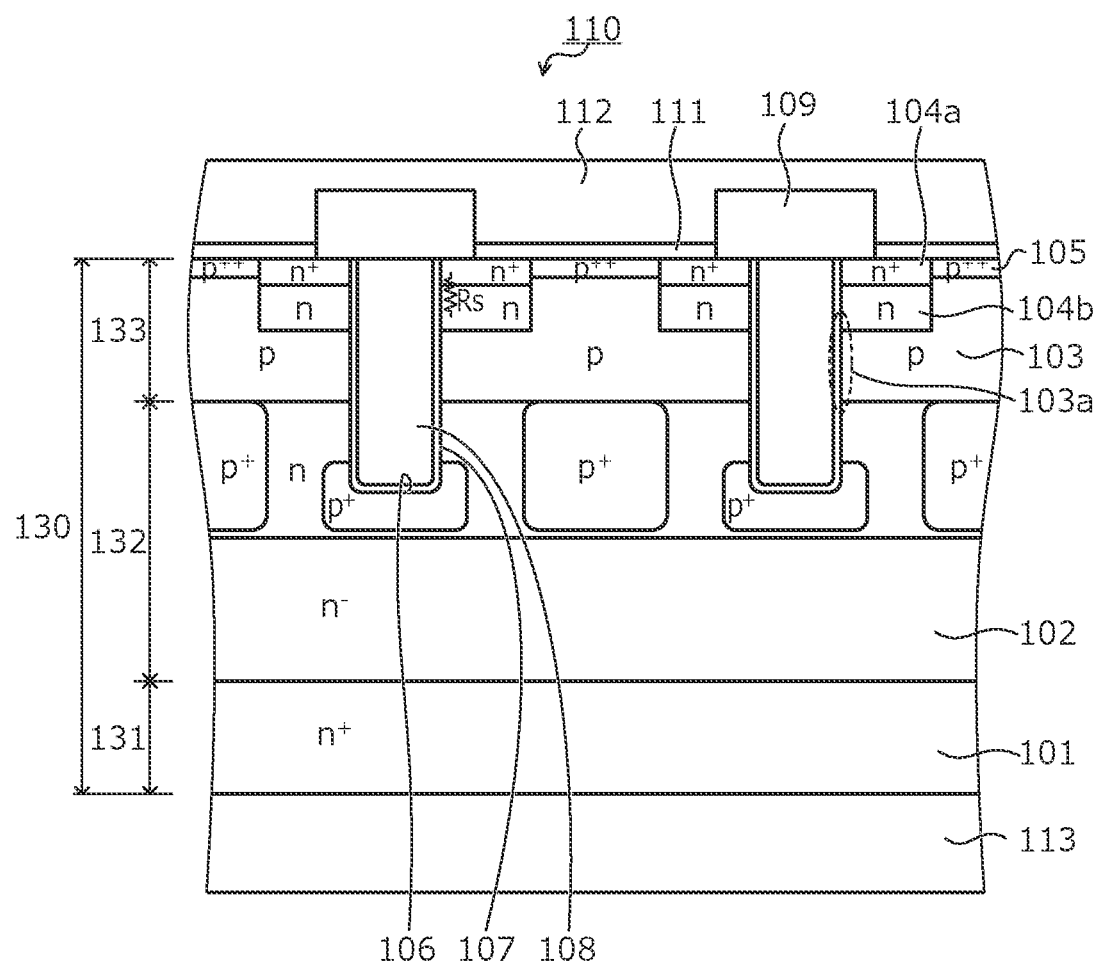
FIG. 12 is a cross-sectional view of a structure of a conventional silicon carbide semiconductor device.

First, problems associated with the conventional techniques are discussed. In the conventional silicon carbide semiconductor device 110 (refer to FIG. 12), the source follower effect cannot be sufficiently obtained. A reason for this is as follows. FIG. 11 is a circuit diagram depicting an equivalent circuit of FIG. 12. When the conventional silicon carbide semiconductor device 110 is in an ON state, an electron accumulation layer (not depicted) is formed at portions of the n-type source resistance regions 104b in contact with the gate insulating films 107; the electron accumulation layer is a current path outside the control of gates, present between the gates and drain of the conventional silicon carbide semiconductor device 110.

The electron accumulation layer is connected in series between the n$^+$-type source regions 104a and the channels 103a and forms accumulation layer resistance 142. Further, a combined resistance of resistors 141 formed by the n-type source resistance regions 104b and the accumulation layer resistance 142 connected in series to the resistors 141 is the source resistance Rs. Therefore, the source resistance Rs has a low resistance value that is a resistance value attributed to the accumulation layer resistance 142 and the source follower effect cannot be sufficiently obtained.

Embodiments of a silicon carbide semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and are repeatedly described.

Figure 1:
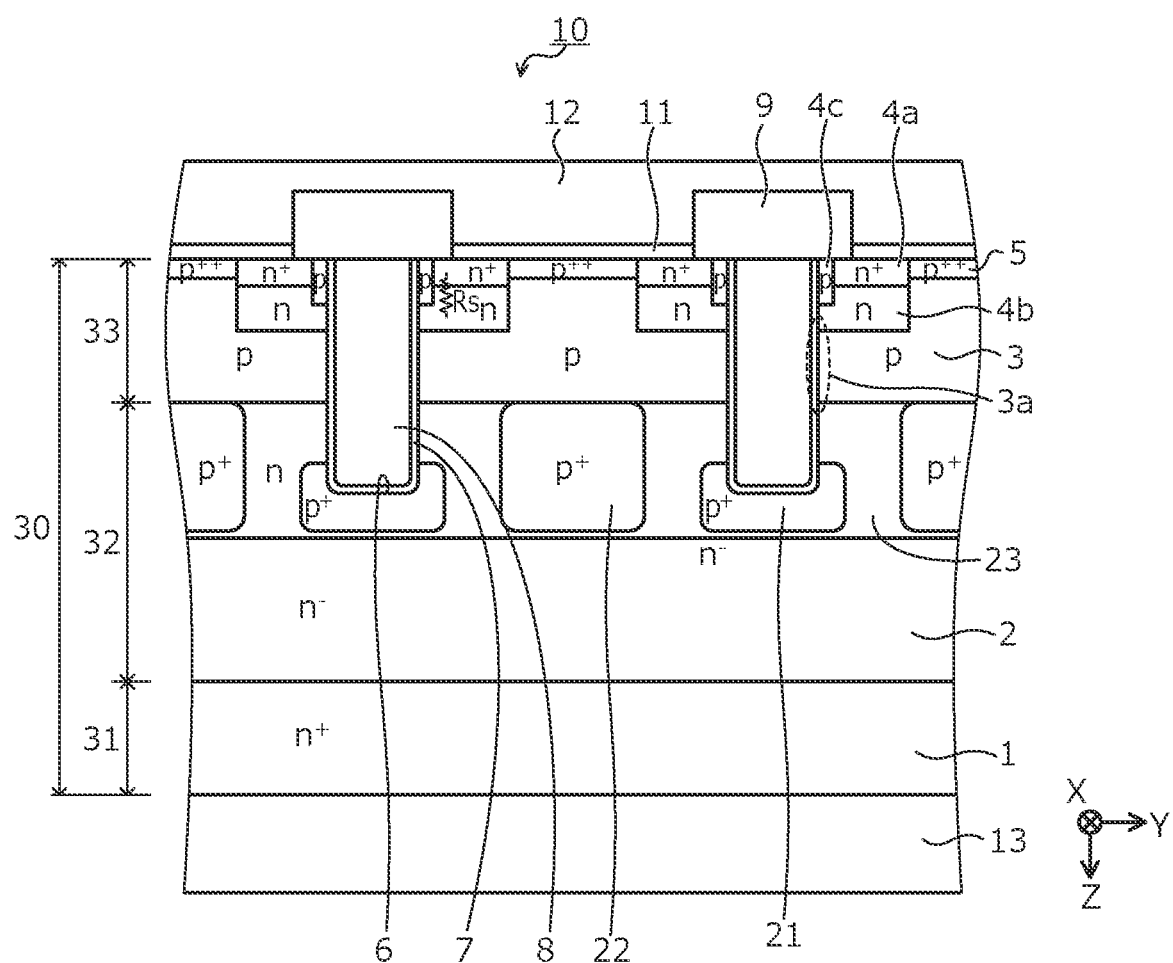
FIG. 1 is a cross-sectional view of a structure of a silicon carbide semiconductor device according to an embodiment.

A structure of a silicon carbide semiconductor device according to an embodiment is described. FIG. 1 is a cross-sectional view of the structure of the silicon carbide semiconductor device according to the embodiment. The silicon carbide semiconductor device 10 according to the embodiment depicted in FIG. 1 is a vertical MOSFET that includes trench gate structures on a front side of a semiconductor substrate (semiconductor chip) 30 containing silicon carbide (SiC) as a semiconductor material. The semiconductor substrate 30 is an epitaxial substrate in which epitaxial layers 32, 33 forming an n$^-$-type drift region (first semiconductor region) 2 and p-type base regions (second semiconductor regions) 3 are sequentially stacked on a front surface of an n$^+$-type starting substrate 31 containing silicon carbide as a semiconductor material.

The semiconductor substrate 30 has a main surface regarded as a front surface (first main surface) thereof that is a surface of the p-type epitaxial layer 33 and a main surface regarded as a back surface (second main surface) thereof that is a back surface of the n$^+$-type starting substrate 31. The n$^+$-type starting substrate 31 is an n$^+$-type drain region 1. The n$^-$-type drift region 2 is a portion of the n$^-$-type epitaxial layer 32, facing the n$^+$-type starting substrate 31 and adjacent to the n$^+$-type starting substrate 31 in a depth direction Z. The p-type base regions 3 are provided between the front surface of the semiconductor substrate 30 and the n$^-$-type drift region 2. An n-type current spreading region 23 is provided between and in contact with the p-type base regions 3 and the n$^-$-type drift region 2.

The n-type current spreading region 23, for example, is a diffused region formed in the n$^-$-type epitaxial layer 32 by ion implantation. The n-type current spreading region 23 is a so-called current spreading layer (CSL) that reduces carrier resistance. In the n-type current spreading region 23, p$^+$-type regions 21, 22 are each selectively provided separate from one another. The p$^+$-type regions 21, 22, for example, are diffused regions formed in the n$^-$-type epitaxial layer 32 by ion implantation. The p$^+$-type regions 21, 22 may be in contact with the n$^-$-type drift region 2.

The p$^+$-type regions 21, 22 are electrically connected to a source electrode (first electrode) 12 described hereinafter, are fixed at a source potential, and have a function of depleting the n-type current spreading region 23 and reducing electric field applied to bottoms of later-described trenches 6, when the MOSFET is OFF. The p$^+$-type regions 21 are provided separate from the p-type base regions 3, at positions closer to the n$^+$-type drain region 1 than are interfaces between the p-type base regions 3 and the n-type current spreading region 23, the p$^+$-type regions 21 being provided to face the bottoms of the trenches 6, respectively, along the depth direction Z. The p$^+$-type regions 22 are provided in the mesa regions, respectively, the p$^+$-type regions 22 being provided to be separate from the trenches 6 and the p$^+$-type regions 21, and in contact with the p-type base regions 3.

The n-type current spreading region 23 may be omitted. In an instance in which the n-type current spreading region 23 is omitted, the p-type base regions 3 and the n$^-$-type drift region 2 are adjacent to each other in the depth direction Z; and the p$^+$-type regions 21, 22 are each selectively provided in the n$^-$-type drift region 2. The trenches 6 penetrate the p-type epitaxial layer 33 from the front surface of the semiconductor substrate 30 in the depth direction Z, reach the n-type current spreading region 23, and terminate in the p$^+$-type regions 21.

The trenches 6, for example, are disposed in a stripe pattern extending in a first direction X parallel to the front surface of the semiconductor substrate 30. N$^+$-type source regions (third semiconductor regions) 4a, n-type source resistance regions (fourth semiconductor regions) 4b, p-type regions (fifth semiconductor regions) 4c, and p$^{++}$-type contact regions 5 described hereinafter and provided between adjacent trenches of the trenches 6 (in mesa regions) also extend in linear shapes along the first direction X. Gate insulating films 7 are provided along inner walls of the trenches 6. In the trenches 6, gate electrodes 8 are provided on the gate insulating films 7 so as to be embedded in the trenches 6.

The n$^+$-type source regions 4a and the p$^{++}$-type contact regions 5 are each selectively provided between the front surface of the semiconductor substrate 30 and the p-type base regions 3. The n$^+$-type source regions 4a are provided closer to the trenches 6 than are the p$^{++}$-type contact regions 5. Each of the n-type regions (the n-type source resistance regions) 4b is provided between and adjacent to one of the n$^+$-type source regions 4a and a portion of one of the p-type base regions 3 where a channel (n-type inversion layer) 3a is formed. The n-type source resistance regions 4b form the source resistance Rs (series resistance from the source electrode 12 to ends of the channels 3a, the ends thereof closest to the source electrode 12).

The n-type source resistance regions 4b are adjacent to the n$^+$-type source regions 4a in the depth direction Z. Each of the p-type regions 4c is provided between one of the gate insulating films 7 at a sidewall of one of the trenches 6 and one of the n$^+$-type source regions 4a, and between the one of the gate insulating films 7 and one of the n-type source resistance regions 4b, and adjacent to the one of the n$^+$-type source regions 4a, the one of the n-type source resistance regions 4b, and the one of the gate insulating films 7. The p-type regions 4c are respectively provided along sidewalls of the trenches 6, in surface regions of the sidewalls of the trenches 6 (portions of inner walls of the trenches 6, substantially orthogonal to the front surface of the semiconductor substrate) and are exposed at the sidewalls of the trenches 6. The p-type regions 4c extend from the front surface of the semiconductor substrate 30, along the sidewalls of the trenches 6, to positions closer to a drain electrode 13 than are interfaces between the n$^+$-type source regions 4a and the n-type source resistance regions 4b.

Ends of the p-type regions 4c, the ends thereof closest to the drain electrode 13, terminate in the n-type source resistance regions 4b. By terminating these ends of the p-type regions 4c in the n-type source resistance regions 4b, the n$^+$-type source regions 4a may be prevented from being in contact with an electron accumulation layer formed near surfaces of portions of the n-type source resistance regions 4b in contact with the gate insulating films 7.

In this manner, the p-type regions 4c are each provided between one of the gate insulating films 7 at a sidewall of one of the trenches 6 and one of the n$^+$-type source regions 4a, and between the one of the gate insulating films 7 and one of the n-type source resistance regions 4b, whereby the n$^+$-type source regions 4a are not in contact with the gate insulating films 7. Furthermore, a contact area between the n-type source resistance regions 4b and the gate insulating films 7 decreases. As a result, even when an electron accumulation layer is formed in portions of the n-type source resistance regions 4b in contact with the gate insulating films 7, the n$^+$-type source regions 4a and the channels 3a are not connected by the electron accumulation layer.

While not particularly limited hereto, for example, impurity concentrations of regions may have the following values. The impurity concentration of the p-type base regions 3 is, for example, in a range from about $5\times10^{16}/\text{cm}^3$ to $5\times10^{17}/\text{cm}^3$. The impurity concentration of the n$^+$-type source regions 4a is, for example, in a range from about $5\times10^{18}/\text{cm}^3$ to $1\times10^{21}/\text{cm}^3$.

The impurity concentration of the n-type source resistance regions 4b is, for example, in a range from about $1\times10^{16}/\text{cm}^3$ to $1\times10^{18}/\text{cm}^3$. When the impurity concentration of the n-type source resistance regions 4b exceeds the upper limit above, the n-type source resistance regions 4b tend to cease to function as source resistance. When the impurity concentration of the n-type source resistance regions 4b is less than the lower limit above, ON resistance tends to be excessive. Preferably, the impurity concentration of the n-type source resistance regions 4b may be in a range, for example, from about $5\times10^{16}/\text{cm}^3$ to $5\times10^{17}/\text{cm}^3$.

The impurity concentration of the p-type regions 4c is, for example, in a range from about $1\times10^{18}/\text{cm}^3$ to $1\times10^{21}/\text{cm}^3$. When the impurity concentration of the p-type regions 4c exceeds the upper limit above, in addition to increases in cost, leak current due to crystal defects may increase. When the impurity concentration of the p-type regions 4c is less than the lower limit above, an effect tends to decrease due to punch-through. Preferably, the impurity concentration of the p-type regions 4c may be, for example, in a range from about $5\times10^{18}/\text{cm}^3$ to $1\times10^{20}/\text{cm}^3$.

The n$^+$-type source regions 4a, the p-type regions 4c, and the p$^{++}$-type contact regions 5 are exposed at the front surface of the semiconductor substrate 30. Without providing the p$^{++}$-type contact regions 5, the p-type base regions 3 may be exposed at the front surface of the semiconductor substrate 30. Portions of the p-type epitaxial layer 33, excluding the n$^+$-type source regions 4a, the n-type source resistance regions 4b, the p-type regions 4c, and the p$^{++}$-type contact regions 5, are the p-type base regions 3. The p-type base regions 3, the n$^+$-type source regions 4a, the n-type source resistance regions 4b, the p-type regions 4c, the p$^{++}$-type contact regions 5, the trenches 6, the gate insulating films 7, and the gate electrodes 8 configure the trench gate structures.

An interlayer insulating film 9 is provided in an entire area of the front surface of the semiconductor substrate 30 and covers the gate electrodes 8. In contact holes of the interlayer insulating film 9, the n$^+$-type source regions 4a and the p$^{++}$-type contact regions 5 are exposed. In the contact holes of the interlayer insulating film 9, on the front surface of the semiconductor substrate 30, metal electrodes (ohmic electrodes: first electrodes) 11 are provided in ohmic contact with the semiconductor substrate 30. The ohmic electrodes 11 are in ohmic contact with the n$^+$-type source regions 4a and the p$^{++}$-type contact regions 5, and are electrically connected to the p-type base regions 3, the n$^+$-type source regions 4a, the n-type source resistance regions 4b, and the p$^{++}$-type contact regions 5.

In an instance in which the p$^{++}$-type contact regions 5 are omitted, the ohmic electrodes 11 are in ohmic contact with the p-type base regions 3 instead of the p$^{++}$-type contact regions 5, in the contact holes of the interlayer insulating film 9. The source (first electrode) 12 is embedded in the contact holes, is in contact with the ohmic electrodes 11, and is electrically connected to the ohmic electrodes 11. The drain electrode (second electrode) 13 is provided on an entire area of the back surface (back surface of the n$^+$-type starting substrate 31) of the semiconductor substrate 30. The drain electrode 13 is in contact with the n$^+$-type drain region 1 (the n$^+$-type starting substrate 31) and is electrically connected to the n$^+$-type drain region 1.

Figure 2:
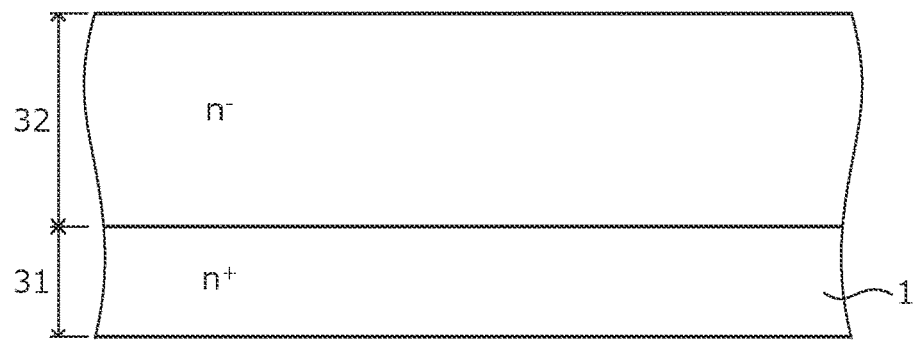
FIG. 2 is a cross-sectional view of a state of the silicon carbide semiconductor device according to the embodiment during manufacture.

Next, a method of manufacturing the silicon carbide semiconductor device according to the embodiment is described taking, as an example, an instance in which the silicon carbide semiconductor device 10 according to the embodiment depicted in FIG. 1 is manufactured. FIGS. 2, 3, 4, 5, 6, 7, and 8 are cross-sectional views of states of the silicon carbide semiconductor device according to the embodiment during manufacture. First, as depicted in FIG. 2, on the front surface of the n$^+$-type starting substrate (semiconductor wafer) 31 in which silicon carbide is used as a semiconductor material, the n$^-$-type epitaxial layer 32 is epitaxially grown.

Figure 3:
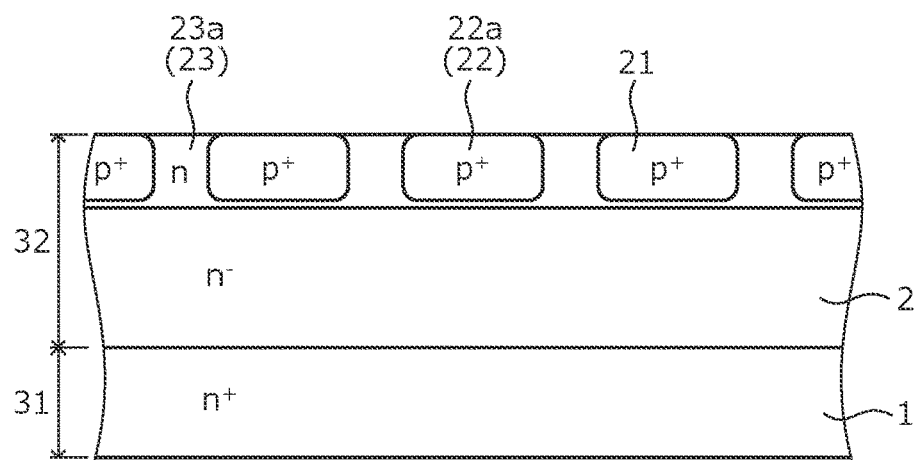
FIG. 3 is a cross-sectional view of a state of the silicon carbide semiconductor device according to the embodiment during manufacture.

Next, as depicted in FIG. 3, the p$^+$-type regions 21, 22a are each selectively formed in surface regions of the n$^-$-type epitaxial layer 32 by photolithography and ion implantation of a p-type impurity. The p$^+$-type regions 21 and the p$^+$-type regions 22a, for example, are disposed to repeatedly alternate one another in a second direction Y that is parallel to the front surface of the semiconductor substrate 30 and orthogonal to the first direction X.

Next, n-type regions 23a are formed in surface regions of the n$^-$-type epitaxial layer 32 by photolithography and ion implantation of an n-type impurity, the n-type regions 23a being formed between and in contact with the p$^+$-type regions 21, 22a adjacent to one another. Portions of the n$^-$-type epitaxial layer 32 between the n$^+$-type starting substrate 31 and the n-type regions 23a and the p$^+$-type regions 21, 22a form the n$^-$-type drift region 2.

Figure 4:
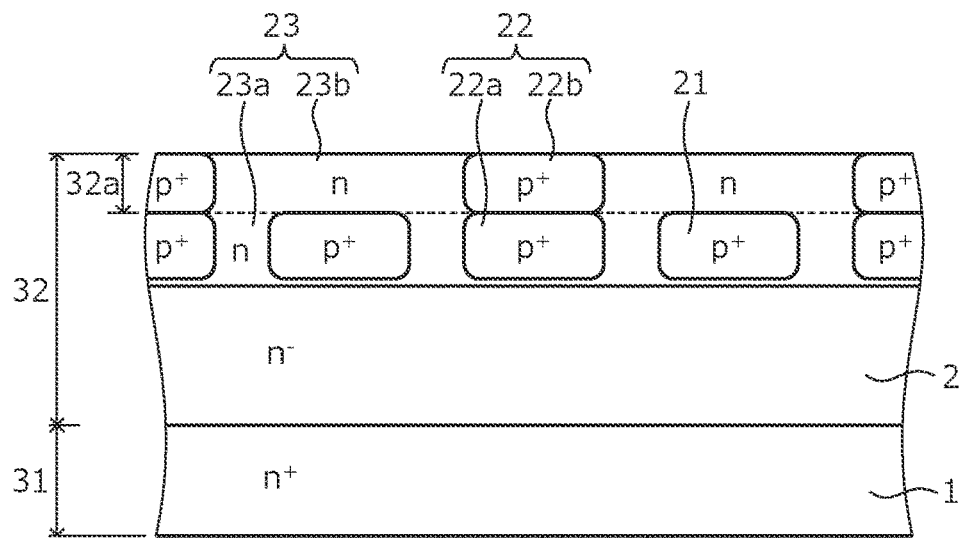
FIG. 4 is a cross-sectional view of a state of the silicon carbide semiconductor device according to the embodiment during manufacture.

Next, as depicted in FIG. 4, a thickness of the n$^-$-type epitaxial layer 32 is increased by epitaxial growth of a portion 32a. Next, in the portion 32a by which the thickness of the n$^-$-type epitaxial layer 32 is increased, the p$^+$-type regions 22b are selectively formed by photolithography and ion implantation of a p-type impurity; the p$^+$-type regions 22a, 22b adjacent to one another in the depth direction are connected, thereby forming the p$^+$-type regions 22.

Next, in the portion 32a by which the thickness of the n$^-$-type epitaxial layer 32 is increased, n-type regions 23b are formed by photolithography and ion implantation of an n-type impurity, the n-type regions 23b being formed between and in contact with adjacent p$^+$-type regions 22b of the p$^+$-type regions 22b, and to a depth reaching the n-type regions 23a. The n-type regions 23a, 23b adjacent to one another in the depth direction are connected, thereby forming the n-type current spreading region 23.

Figure 5:
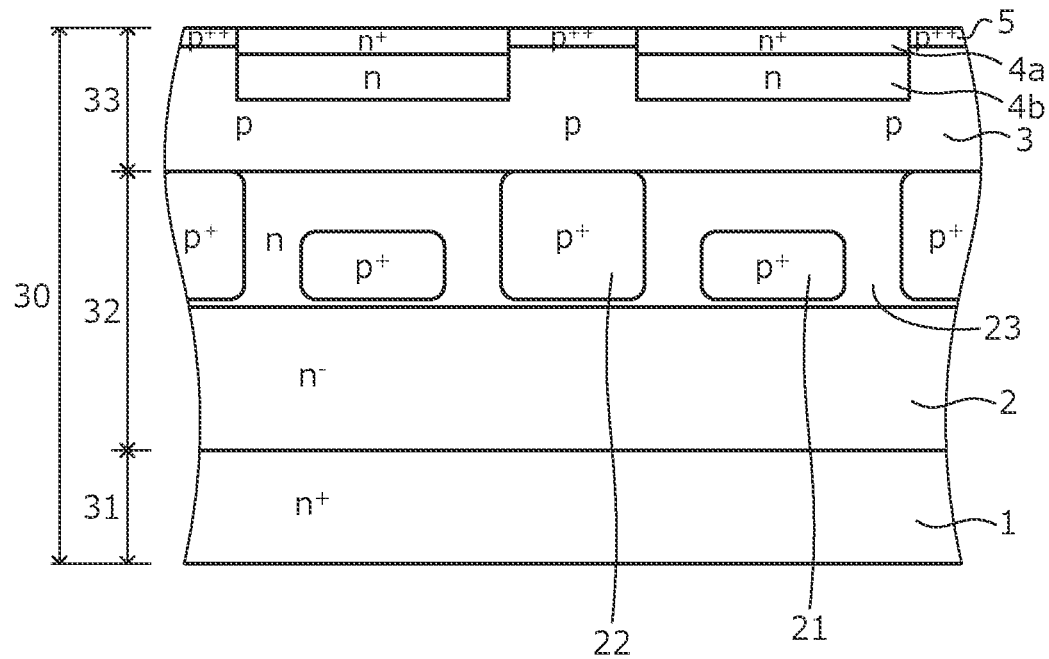
FIG. 5 is a cross-sectional view of a state of the silicon carbide semiconductor device according to the embodiment during manufacture.

Next, as depicted in FIG. 5, the p-type epitaxial layer 33 is epitaxially grown on the n$^-$-type epitaxial layer 32. As a result, the semiconductor substrate (semiconductor wafer) 30 is fabricated in which the n$^-$-type epitaxial layer 32 and the p-type epitaxial layer 33 are sequentially stacked on the front surface of the n$^+$-type starting substrate 31.

Next, a process including photolithography and ion implantation as one set is repeatedly performed under different conditions, whereby the n$^+$-type source regions 4a, the n-type source resistance regions 4b, and the p$^{++}$-type contact regions 5 are each selectively formed in surface regions of the p-type epitaxial layer 33. Portions between the n$^-$-type epitaxial layer 32 and the n$^+$-type source regions 4a, the n-type source resistance regions 4b, and the p$^{++}$-type contact regions 5 form the p-type base regions 3.

For example, each ion implantation for forming the n$^+$-type source regions 4a and the n-type source resistance regions 4b may be performed using a single ion implantation mask. The ion implantation for forming the n-type source resistance regions 4b suffices to be performed by an acceleration energy that is higher than that of the ion implantation for forming the n$^+$-type source regions 4a. The n$^+$-type source regions 4a are formed so as to overlap the n-type source resistance regions 4b, thereby enabling the n$^+$-type source regions 4a to be formed having an impurity concentration that is higher than that of the n-type source resistance regions 4b.

Figure 6:
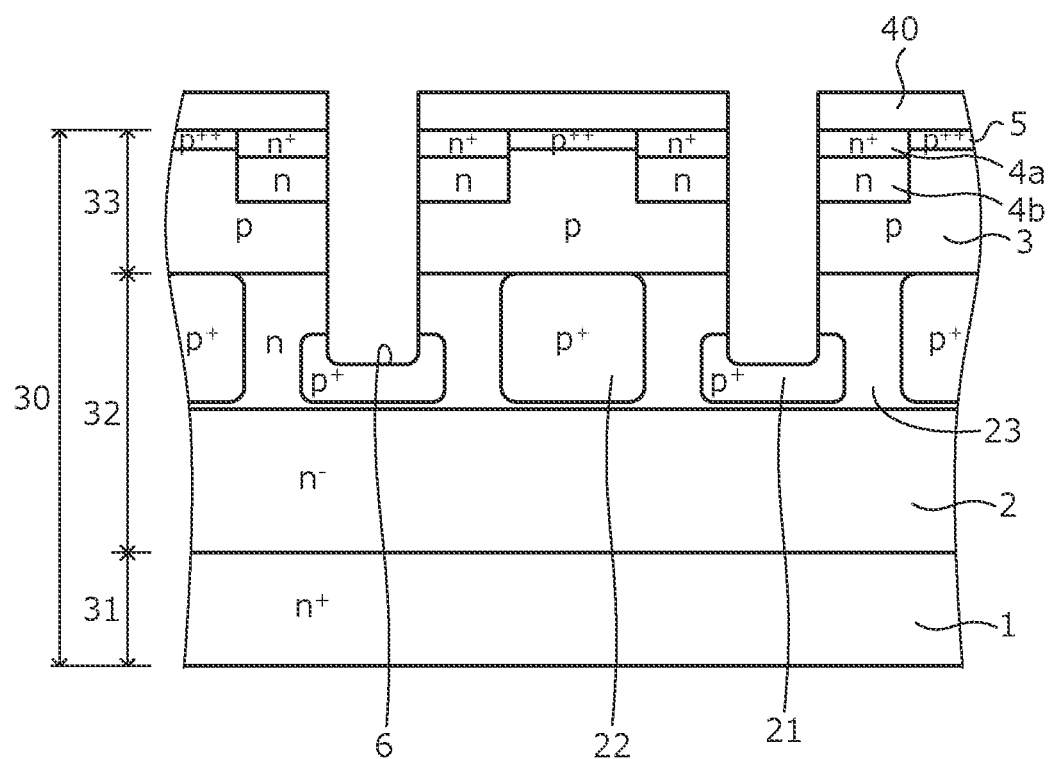
FIG. 6 is a cross-sectional view of a state of the silicon carbide semiconductor device according to the embodiment during manufacture.

Next, as depicted in FIG. 6, for example, an oxide film mask 40 having openings at portions thereof that correspond to formation regions of the trenches 6 is formed by photolithography. Next, etching is performed using the oxide film mask 40 as a mask, whereby the trenches 6 that penetrate the n$^+$-type source regions 4a, the n-type source resistance regions 4b, and the p-type base regions 3, and reach the n-type current spreading region 23 are formed. The bottoms of the trenches 6, for example, may terminate in the p$^+$-type regions 21.

Figure 7:
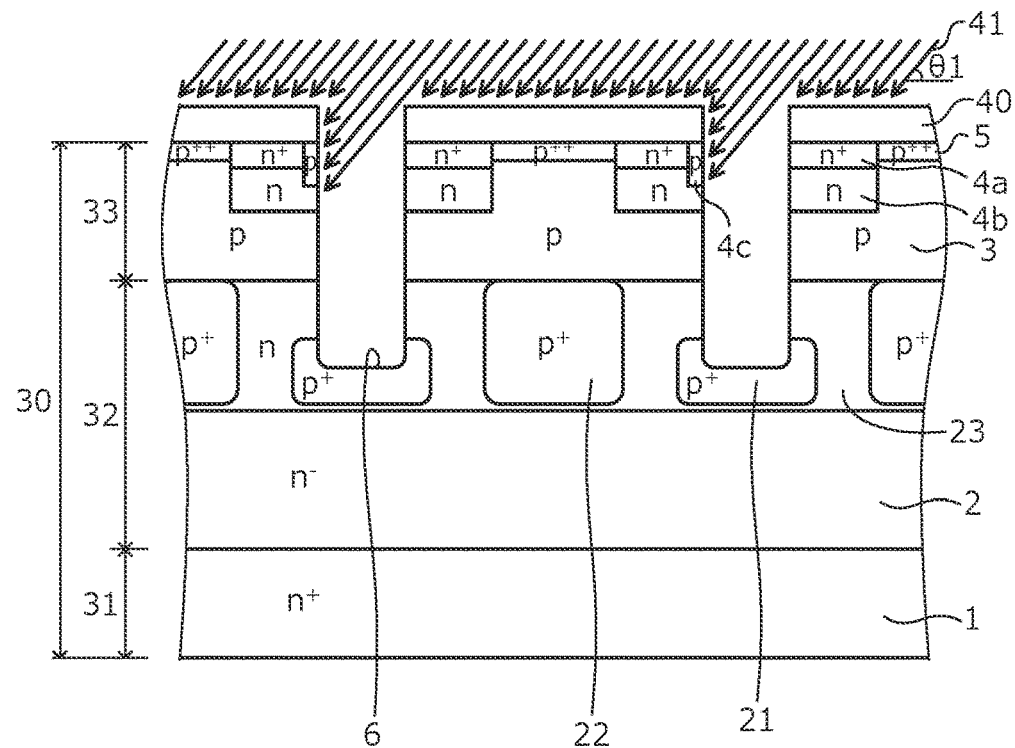
FIG. 7 is a cross-sectional view of a state of the silicon carbide semiconductor device according to the embodiment during manufacture.

Next, as depicted in FIG. 7, for example, the oxide film mask 40 used to form the trenches 6 is used as a mask and from an oblique angle of a predetermined implantation angle θ1 with respect to the front surface of the semiconductor substrate 30, a p-type impurity is ion implanted in a first sidewall of each of the trenches 6 (hereinafter, oblique ion implantation 41). The p-type regions 4c are formed in surface regions of the first sidewalls of the trenches 6 by the oblique ion implantation 41 so as to be exposed at the first sidewalls of the trenches 6; and along the first sidewalls of the trenches 6, the p-type regions 4c reach the n-type source resistance regions 4b from the front surface of the semiconductor substrate 30.

Figure 8:
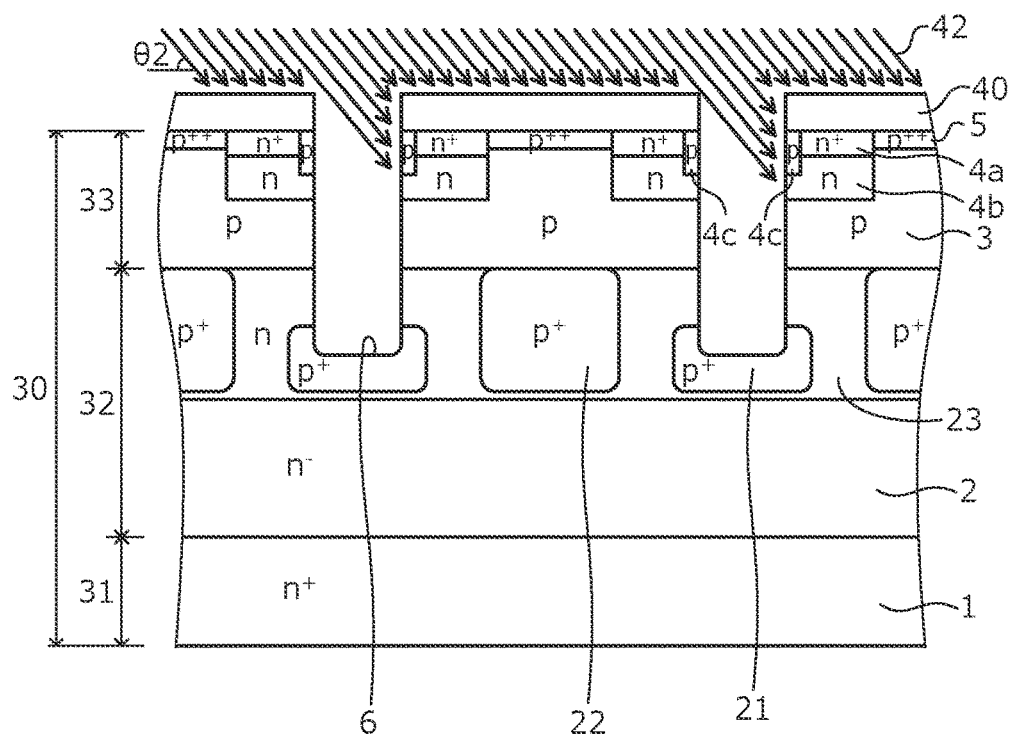
FIG. 8 is a cross-sectional view of a state of the silicon carbide semiconductor device according to the embodiment during manufacture.

Next, as depicted in FIG. 8, for example, the oxide film mask 40 used to form the trenches 6 is used as a mask and from an oblique angle of a predetermined implantation angle θ2 with respect to the front surface of the semiconductor substrate 30, a p-type impurity is ion implanted in a second sidewall of each of the trenches 6 by an oblique ion implantation 42. The p-type regions 4c are formed in surface regions of the second sidewalls of the trenches 6 by the oblique ion implantation 42 so as to be exposed at the second sidewalls of the trenches 6; and along the second sidewalls of the trenches 6, the p-type regions 4c reach the n-type source resistance regions 4b from the front surface of the semiconductor substrate 30.

The oblique ion implantation 42 to the second sidewalls of the trenches 6 is performed by the implantation angle θ2 that, relative to a center of each of the trenches 6, is symmetrical to the implantation angle θ1 of the oblique ion implantation 41 to the first sidewalls of the trenches 6. Other than the implantation angle θ2 of the oblique ion implantation 42 to the second sidewalls of the trenches 6, conditions are identical to those of the oblique ion implantation 41 to the first sidewalls of the trenches 6. The oxide film mask 40 is subsequently removed.

Next, a heat treatment for impurity activation is performed for diffused regions (the p$^+$-type regions 21, 22, the n-type current spreading region 23, the n$^+$-type source regions 4a, the n-type source resistance regions 4b, the p-type regions 4c, and the p$^{++}$-type contact regions 5) formed by ion implantation. The heat treatment may be performed once for all of the diffused regions collectively or may be performed each time diffused regions are formed by ion implantation.

Next, the gate insulating films 7 are formed along the front surface of the semiconductor substrate 30 and the inner walls of the trenches 6. Next, a polysilicon (poly-Si) layer is deposited on the front surface of the semiconductor substrate 30 and embedded in the trenches 6. Next, the polysilicon layer is etched, leaving portions of the polysilicon layer in the trenches 6 to thereby form the gate electrodes 8.

Next, the interlayer insulating film 9 is formed in an entire area of the front surface of the semiconductor substrate 3. Next, the interlayer insulating film 9 and the gate insulating films 7 are selectively removed by photolithography and etching to thereby form contact holes and expose the n$^+$-type source regions 4a and the p$^{++}$-type contact regions 5. Next, in the contact holes, on the front surface of the semiconductor substrate 30, the ohmic electrodes 11 are formed in ohmic contact with the n$^+$-type source regions 4a and the p$^{++}$-type contact regions 5.

On the back surface of the semiconductor substrate 30, an ohmic electrode (not depicted) is formed in ohmic contact therewith. On the front surface of the semiconductor substrate 30, the source electrode 12 is formed so as to be embedded in the contact holes and in contact with the ohmic electrodes 11. On the ohmic electrode of the back surface of the semiconductor substrate 30, the drain electrode 13 is formed. Thereafter, semiconductor wafer is diced (cut) into individual chips, whereby the silicon carbide semiconductor device 10 depicted in FIG. 1 is completed.

As described above, according to the embodiment, each of the p-type regions is provided between one of gate insulating films at a sidewall of one of the trenches and one of the n$^+$-type source regions, and between the one of the gate insulating films and one of the n-type source resistance regions. Due to the p-type regions, even when an electron accumulation layer is formed in portions of the n-type source resistance regions in contact with the gate insulating films, the n$^+$-type source regions and the channels are not connected by the electron accumulation layer. As a result, source resistance having a high resistance value that may be realized by the n-type source resistance regions alone may be connected between the n$^+$-type source regions and the channels. Therefore, the source follower effect may be sufficiently obtained as compared to the conventional structure (refer to FIGS. 11 and 12).

Further, the n$^+$-type source regions and the channels are not connected by the electron accumulation layer and therefore, drain-source current during a saturated state may be reduced more than in the conventional structure. Moreover, gate-source voltage is maintained at a constant value by the source follower effect, and variation of drain-source current due to variation of the ON resistance or variation of gate-source voltage may be suppressed. Further, by the source follower effect, decreases in the effective gate-source voltage are small in current regions normally used, and the effective gate-source voltage in large current regions such as during short-circuit may be greatly reduced, whereby the tradeoff relationship between enhancement of the short circuit capability and reduction of the ON resistance may be improved.

Figure 9:
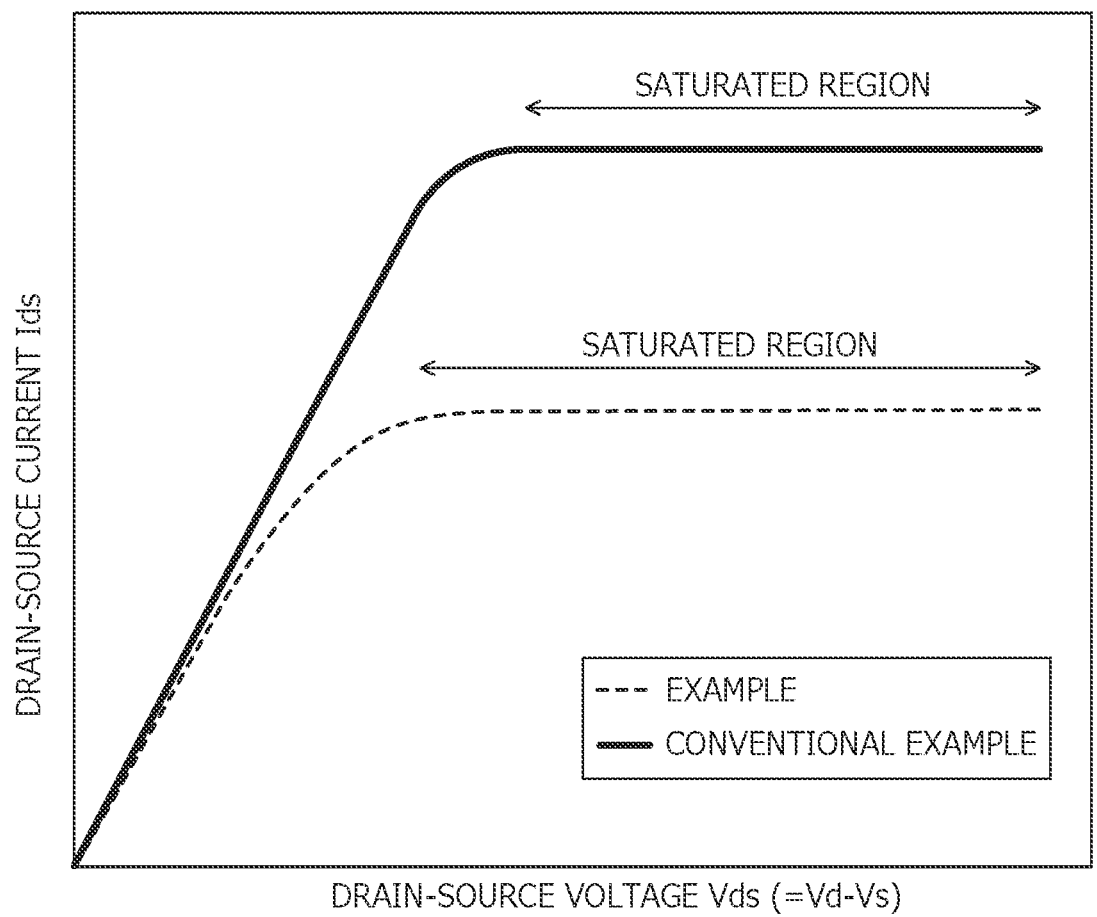
FIG. 9 is a characteristics diagram schematically depicting voltage/current characteristics of the silicon carbide semiconductor device according to the embodiment.
Figure 10:
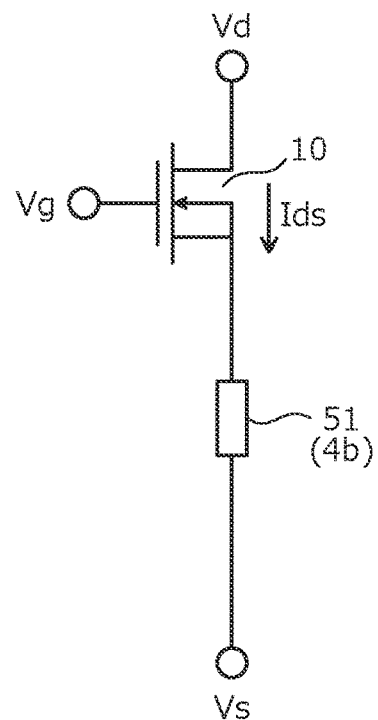
FIG. 10 is a circuit diagram depicting an equivalent circuit of FIG. 1.

Voltage/current characteristics of the silicon carbide semiconductor device 10 according to the embodiment (refer to FIG. 1) were verified. FIG. 9 is a characteristics diagram schematically depicting voltage/current characteristics of the silicon carbide semiconductor device according to the embodiment. In FIG. 9, a horizontal axis and a vertical axis respectively indicate drain-source voltage Vds and drain-source current Ids of the silicon carbide semiconductor device 10 according to the embodiment. FIG. 10 is a circuit diagram depicting an equivalent circuit of FIG. 1.

Results of measurement of the drain-source voltage Vds and the drain-source current Ids of the silicon carbide semiconductor device 10 according to the embodiment (hereinafter, example) described above are schematically depicted in FIG. 9. Further, in FIG. 9, results of measurement of the drain-source voltage Vds and the drain-source current Ids of the conventional silicon carbide semiconductor device 110 (refer to FIGS. 11 and 12, hereinafter, conventional example) are schematically depicted. Reference numeral 51 is a resistor that is the source resistance Rs due to the n-type source resistance regions 4b.

From the results depicted in FIG. 9, in the example, it was confirmed that the drain-source current Ids in a saturated region could be reduced as compared to the conventional example. As described above, a reason for this is that due to the p-type regions 4c, even when an electron accumulation layer is formed in portions of the n-type source resistance regions 4b in contact with the gate insulating films 7, the n$^+$-type source regions 4a and the channels 3a are not connected by the electron accumulation layer.

In the foregoing, various modifications are possible, and in the embodiments described above, for example, dimensions, impurity concentrations, etc. of regions are variously set according to necessary specifications.

According to the embodiments of the invention described above, even when an electron accumulation layer is formed in portions of the n-type source resistance regions (fourth semiconductor regions) in contact with the gate insulating films, the n$^+$-type source regions (third semiconductor regions) and the channels are not connected by the electron accumulation layer. As a result, source resistance having a high resistance value that may be realized by the n-type source resistance regions alone may be connected between the n$^+$-type source regions and the channels; and therefore, the source follower effect may be obtained sufficiently.

A silicon carbide semiconductor device of the present invention achieves an effect in that the tradeoff relationship between enhancement of short circuit capability and reduction of the ON resistance may be improved.

As described above, a silicon carbide semiconductor device according to the present invention is useful for power semiconductor devices used in power converting equipment and power source devices of various types of industrial machines.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a semiconductor substrate containing silicon carbide and having a first main surface and a second main surface opposite to each other;
   a first semiconductor region of a first conductivity type, provided in the semiconductor substrate;

a plurality of second semiconductor regions of a second conductivity type, provided in the semiconductor substrate, between the first main surface of the semiconductor substrate and the first semiconductor region;

a plurality of third semiconductor regions of the first conductivity type, provided in the semiconductor substrate, between the first main surface of the semiconductor substrate and the plurality of second semiconductor regions;

a plurality of fourth semiconductor regions of the first conductivity type, each provided in the semiconductor substrate between one of the plurality of second semiconductor regions and one of the plurality of third semiconductor regions, and adjacent to the one of the plurality of third semiconductor regions in a depth direction, the plurality of fourth semiconductor regions having an impurity concentration lower than that of the plurality of third semiconductor regions;

a plurality of trenches penetrating the plurality of third semiconductor regions, the plurality of fourth semiconductor regions, and the plurality of second semiconductor regions;

a plurality of gate insulating films provided along inner walls of the plurality of trenches, respectively;

a plurality of gate electrodes respectively provided on the plurality of gate insulating films in the plurality of trenches;

a plurality of fifth semiconductor regions of the second conductivity type, each provided in the semiconductor substrate between one of the plurality of gate insulating films at the inner wall of one of the plurality of trenches, and one of the plurality of third semiconductor regions and one of the plurality of fourth semiconductor regions through both of which said one of the plurality of trenches penetrates, said each fifth semiconductor region being adjacent to said one of the plurality of third semiconductor regions, said one of the plurality of fourth semiconductor regions, and said one of the plurality of gate insulating films;

a plurality of first electrodes electrically connected to the plurality of third semiconductor regions, the plurality of fourth semiconductor regions, and the plurality of second semiconductor regions; and a second electrode provided on the second main surface of the semiconductor substrate.

2. The silicon carbide semiconductor device according to claim 1, wherein said each fifth semiconductor region extends along a sidewall of said one of the plurality of trenches in the depth direction from the first main surface of the semiconductor substrate, toward the second main surface of the semiconductor substrate, penetrates through said one of the plurality of third semiconductor regions and terminates in said one of the plurality of fourth semiconductor regions.

3. The silicon carbide semiconductor device according to claim 1, further comprising:

a current spreading region provided between the first semiconductor region and the plurality of second semiconductor regions, wherein each of the plurality of trenches reaches the current spreading region.

* * * * *